United States Patent [19]

Fukui et al.

[11] Patent Number: 5,241,455

[45] Date of Patent: Aug. 31, 1993

[54] L-SHAPED CHANNEL WIRING METHOD

[75] Inventors: Masahiro Fukui; Yoshiyuki Kawakami, both of Osaka, Japan

[73] Assignee: Matsushita Electric Industrial Co., Ltd., Osaka, Japan

[21] Appl. No.: 812,002

[22] Filed: Dec. 23, 1991

[30] Foreign Application Priority Data

Dec. 28, 1990 [JP] Japan .................................. 2-408815

[51] Int. Cl.$^5$ ............................................. H05K 1/18
[52] U.S. Cl. .................................... 361/778; 361/782; 361/761; 361/777
[58] Field of Search ................. 174/261; 257/692–698; 361/393, 394, 396, 400, 401, 406, 409, 410, 413, 416, 417, 419

[56] References Cited

U.S. PATENT DOCUMENTS 4,875,139 10/1989 Fukui ................................. 361/410

Primary Examiner—Leo P. Picard
Assistant Examiner—D. Sparks
Attorney, Agent, or Firm—Willian Brinks Olds Hofer Gilson & Lione

[57] ABSTRACT

To minimize the area of an L-shaped channel wiring region between VLSI circuit blocks, a trunk 1 is formed in the direction along L-shaped sides A and B in the wiring region interposed between the L-shaped sides A and B of circuit blocks CB1 and CB2 having terminals on their sides. The trunk 1 is converted into a polygonal line so as to occupy two tracks. The polygonal line is obtained by combining a line segment in the direction along the L-shaped sides A and B with a line segment parallel to the middle angle direction D of an L-shaped angle.

14 Claims, 5 Drawing Sheets

L-SHAPED CHANNEL WIRING METHOD

BACKGROUND OF THE INVENTION

The present invention relates to an L-shaped channel wiring method for optimizing wiring configurations between circuit blocks in the layout design of a Very Large-Scale Integrated circuit (VLSI circuit).

Conventionally, there has been adopted a method for converting a horizontal line, i.e., a trunk into an L-shaped line obtained by combining horizontal and vertical line segments so as to minimize a wiring area for a straight line-shaped channel between VLSI circuit blocks.

U.S. Pat. No. 4,875,139 has disclosed an L-shaped channel wiring method in which a line segment in the direction along an L-shaped side, i.e., a trunk, and a line segment parallel to the middle angle direction of an L-shaped angle on the trunk, i.e., a branch line is drawn in mutually insulated separate wiring layers in a wiring region interposed between the L-shaped sides of two circuit blocks having terminals on their sides, and the trunk is connected to the branch line by a through-hole in the insulated layer at the intersection of the trunk and the branch line so that wiring is formed.

Referring to the conventional L-shaped channel wiring method, however, the bending of the trunk is not allowed. Consequently, the wiring region cannot fully be minimized.

More specifically, the trunk is formed by an L-shaped line comprised of one or two straight lines. Consequently, only one trunk is wired in a wiring region. As a result, the space between the circuit blocks is increased so that the wiring region is made larger.

It is an object of the present invention to convert a trunk into a polygonal line obtained by combining a line segment in the direction along an L-shaped side with a line segment parallel to the middle angle direction of an L-shaped angle so as to minimize the area of a wiring region.

SUMMARY OF THE INVENTION

To achieve the above-mentioned object, the present invention provides an L-shaped channel wiring method in which a trunk in the direction along an L-shaped side and a branch line parallel to the middle angle direction of an L-shaped angle on the trunk are drawn in separate wiring layers mutually insulated by an insulating layer in a wiring region interposed between the L-shaped sides of two circuit blocks having terminals on their sides, and the trunk is connected to the branch line by a through-hole in the insulating layer at the intersection of the trunk and the branch line so that wiring is formed. The trunk is converted into a polygonal line obtained by combining a line segment in the direction along the L-shaped side with a line segment parallel to the middle angle direction of the L-shaped angle.

Furthermore, the present invention provides an L-shaped channel wiring method in which L-shaped sides A and B are provided on two circuit blocks having terminals on their sides, comprising the steps of: forming wiring topology among terminals to be wired at the same potential by a trunk drawn in the direction along the L-shaped side and movable in the middle angle direction of an L-shaped angle on the L-shaped side adding a branch line having a variable length and extending in the middle angle direction of the L-shaped angle from the terminal to a position in which it is connected to the trunk; converting the trunk into a polygonal line obtained by combining a line segment in the direction along the L-shaped side with a line segment parallel to the middle angle direction of the L-shaped angle and moving the same close to the side A; bringing the side B close to the side A so as to fix the relative positions of the sides A and B; and adjusting the shape of the trunk so as to minimize the bending thereof.

According to the present invention, the trunk is wired like a polygonal line so as to occupy two wiring regions. In addition, other trunks are also wired in the same wiring region as one particular trunk. Consequently, useless wiring regions can be eliminated. As a result, L-shaped channel wiring can be realized in a smaller area. Thus, remarkable effects can be obtained. By way of example, it is easy to minimize the wiring region by Computer-Aided Design (CAD).

This and other objects, features and advantages of the present invention will become more apparent upon a reading of the following detailed description and drawings.

DETAILED DESCRIPTION OF THE PREFERRED EMBODIMENT

An embodiment of the present invention will be described in detail with reference to the drawings.

Figure 1:
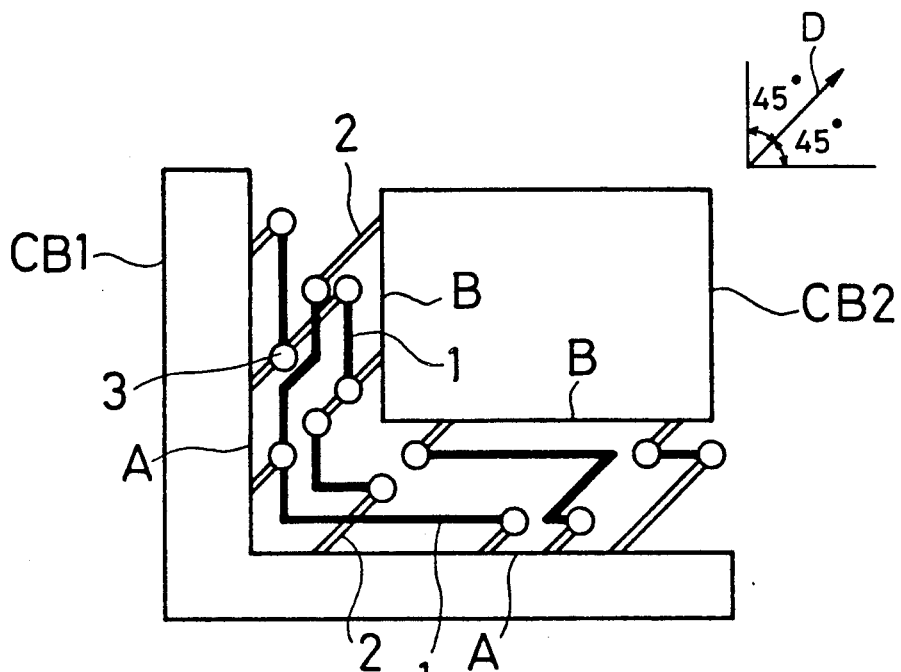
FIG. 1 is a wiring diagram of an L-shaped channel according to the present invention.
Figure 2:
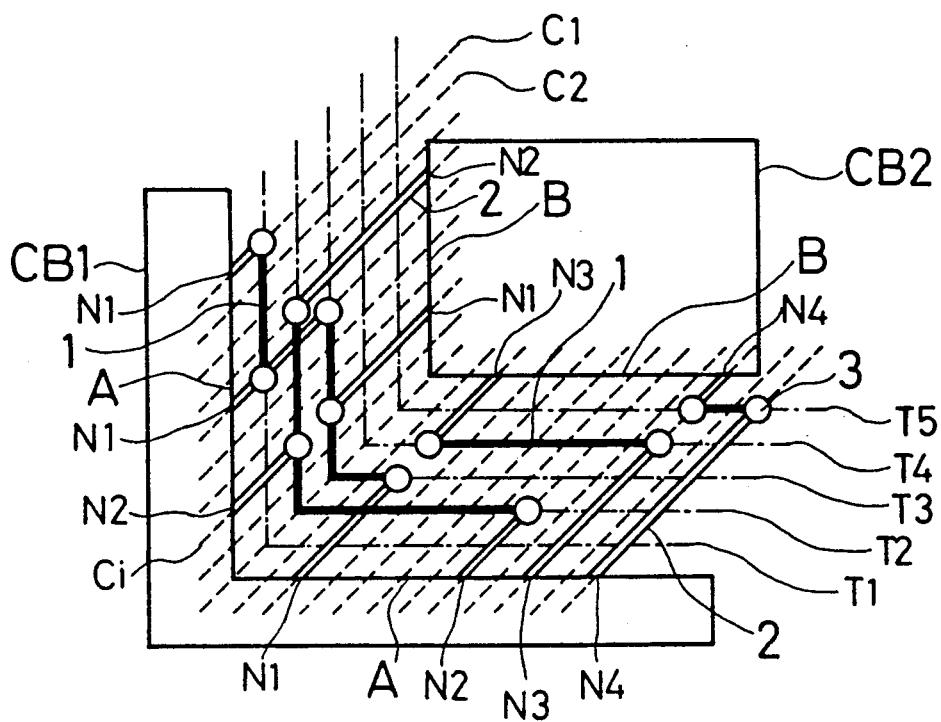
FIG. 2 is a wiring diagram of the L-shaped channel before trunk bending.

FIG. 1 shows the state of wiring according to the present invention. FIG. 2 shows the state of wiring before trunk bending similar to the prior art. In FIGS. 1 and 2, an L-shaped channel is a wiring region interposed between the L-shaped sides A and B of circuit blocks CB1 and CB2. The circuit blocks CB1 and CB2 have terminals on their sides. A trunk 1 is a line segment in the direction along the L-shaped side. A branched line 2 is a line segment parallel to the middle angle direction D, i.e., the acute angle (45°) direction of an L-shaped angle of 90° on the trunk 1. The trunk 1 and the branch line 2 are drawn in separate wiring layers respectively, which are mutually insulated by an insulating layer. The trunk 1 is connected to the branch line 2 by a through-hole 3 in the insulating layer at the intersection of the trunk 1 and the branch line 2.

A method for wiring the trunk 1 and the branch line 2 can be classified into a grid-base wiring and a gridless wiring. Referring to the grid-base wiring, a region in which wiring can be formed is defined by grids. Referring to the gridless wiring, wiring is freely formed without defining grids. The present invention can be applied to both wirings. According to the present embodiment, the grid-base wiring is used (FIG. 2). In the grid-base wiring, tracks T1, T2, ..., Tm and columns C1, C2, ..., Cn are used. The tracks T1, T2, ..., Tm are provided along the L-shaped channel bent at an angle of 90°, on which the trunk 1 can be drawn. The columns C1, C2, ..., Cn are parallel to one another and intersect the tracks T1, T2, ..., Tm at an angle of 45° in the middle angle direction of the L-shaped angle, on which the branch line 2 can be drawn. The through-hole 3 is created on only the intersection of a track Tk (k=1 to m) and a column Ci (i=1 to n). Nets N1, N2, ..., Nj form a group of terminals to be wired at the same potential. In FIG. 2, the name of a net is given to each terminal.

Referring to the L-shaped channel wiring method shown in FIGS. 1 and 2, for each net Nh (h=1 to j), at least one trunk 1 and a plurality of branch lines 2 are drawn. Each trunk 1 occupies one of the tracks Th (h=1 to m). The trunk 1 can be moved in parallel in the middle angle direction of the L-shaped channel. Each branch line 2 extends from a terminal on the channel side A or B toward the trunk 1. The length of the branch line 2 is variable. When two terminals, one in net N1 on the L-shaped channel side B, the other in net N2 on the L-shaped channel side A, exist on a common column Ci as shown in FIG. 2, the trunk 1 of the net N1 is provided nearer the L-shaped channel side B than that of the net N2.

To allocate the trunk 1 to the track Tk, the positional constraints of each trunk 1 should be satisfied and the number of necessary tracks should be minimized. For that purpose, there is applied a left-edge method or the like which has been used in conventional channel wiring.

Figure 3:
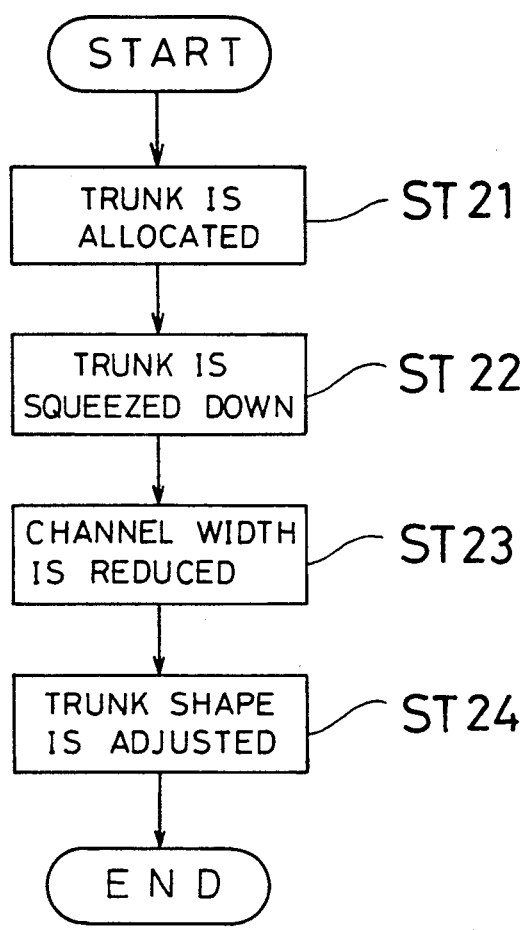
FIG. 3 is a flow chart of processing according to the present invention.

The wiring topology of the trunk 1 will be described for each step in accordance with a flow chart shown in FIG. 3.

1. Step ST21 at which a trunk is allocated to a track.

First, each trunk 1 is allocated to the track Tk by a conventional L-shaped channel wiring method (see FIG. 2).

2. Step St22 at which a trunk is squeesed down.

Figure 4:
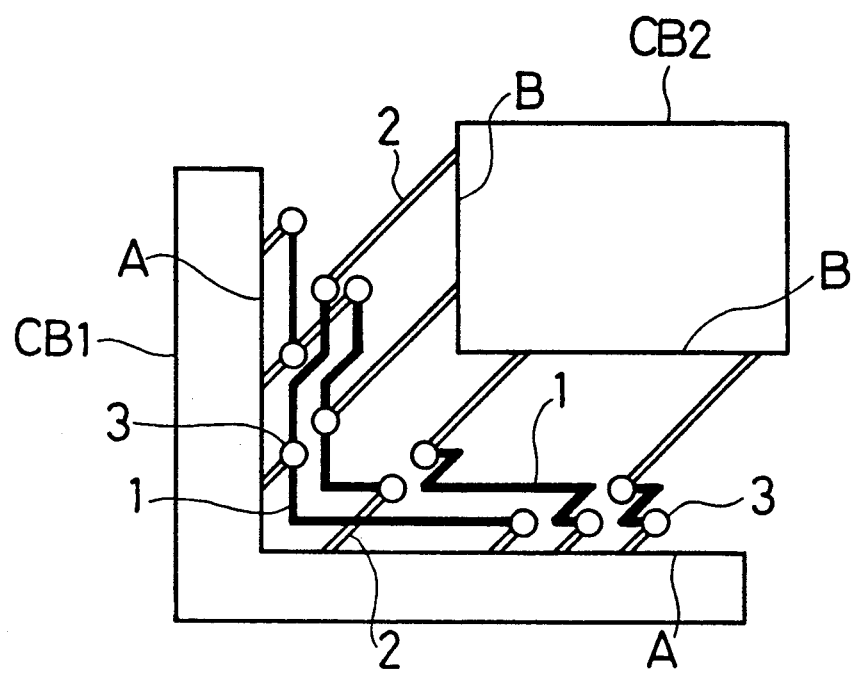
FIG. 4 is a wiring diagram after trunk squeeze-down.

Then, the trunk 1 is bent in the middle angle direction of the L-shaped angle such that it is brought as close to the side A of the L-shaped channel as possible (see FIG. 4).

Figure 5A:
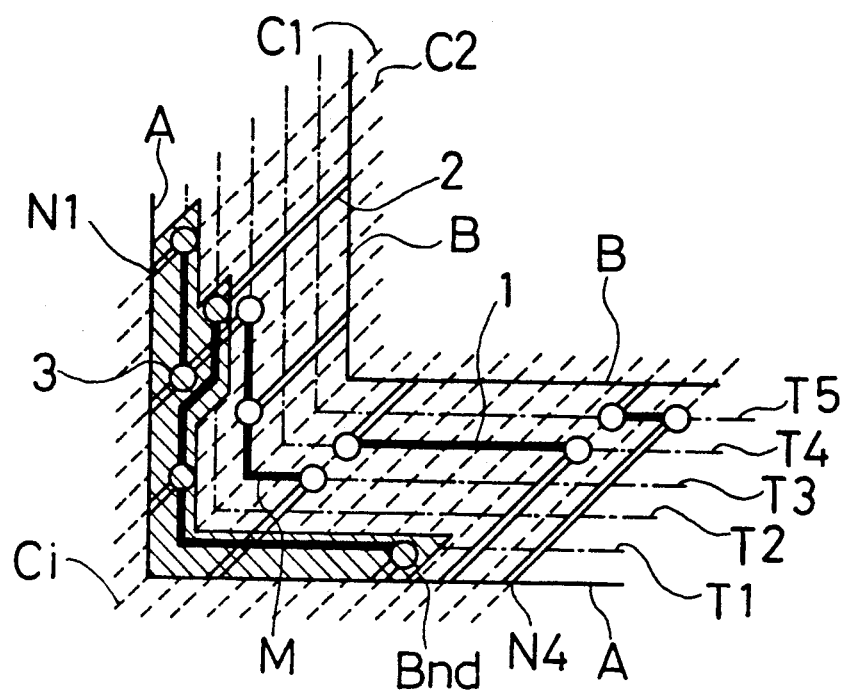
FIGS. 5a to 5c are wiring diagrams for explaining the process of trunk squeeze-down.
Figure 5B:
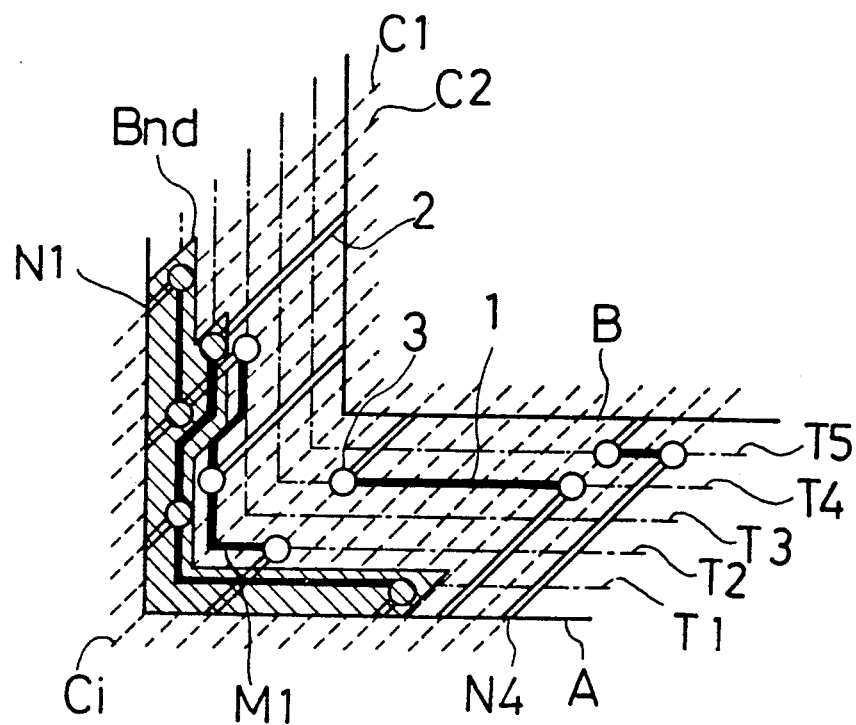
Figure 5C:
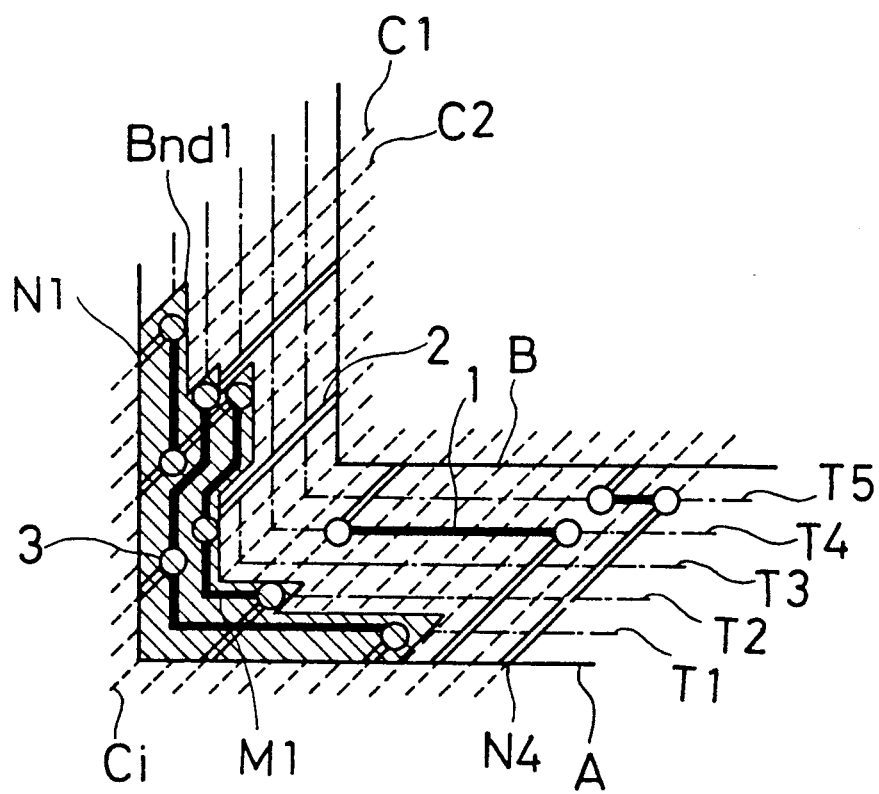

The conversion of the wiring configuration shown in FIG. 2 into that shown in FIG. 4 will be described with reference to FIGS. 5a to 5c. The L-shaped channel side A is defined as a boundary Bnd. Subsequent operations are repeated for all the trunks 1 in order from the lower left. By way of example, in the state where a trunk M is selected, there is found a region including grid points occupied by the trunks 1 which have already been processed, defined by its boundary Bnd as shown in FIG. 5a. Then, the trunk M is bent on the track Tk and the column Ci such that it is brought as close to the side A along the boundary Bnd as possible (see FIG. 5b). A region covering grid points occupied by a trunk M1 thus bent is defined as another boundary Bnd1 (see FIG. 5c). If the above-mentioned operations are repeated, there can be obtained wiring shown in FIG. 4.

3. Step St23 at which a channel width is reduced.

Figure 6:
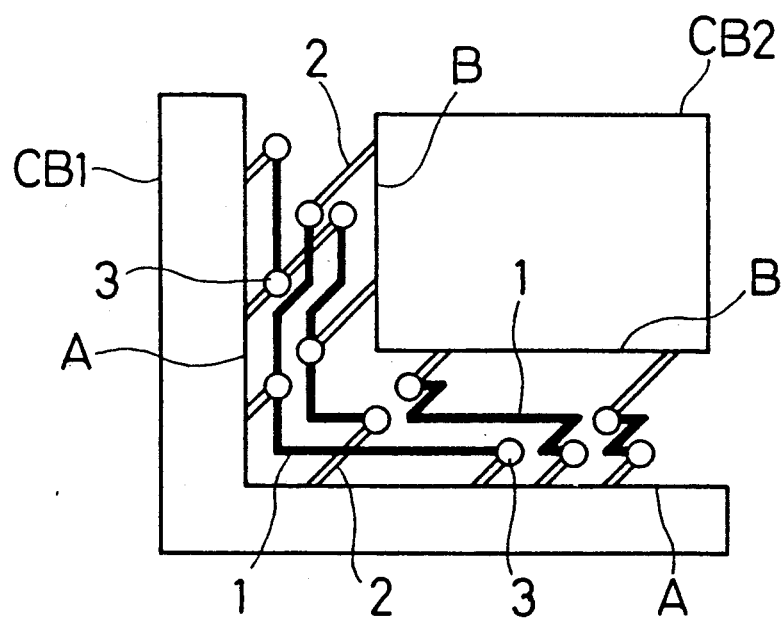
FIG. 6 is a wiring diagram after channel compaction.

The side B of the L-shaped channel is brought as close to the side A as possible (see FIG. 6). In this case, a channel width is reduced from 5 tracks to 3 tracks.

4. Step St24 at which the shape of a trunk is adjusted.

Finally, an L-shaped channel width is fixed. The shape of the trunk 1 is adjusted such that the unnecessary bending of the trunk 1 is reduced as much as possible. Consequently, there can be obtained wiring shown in FIG. 1.

The branch line 2 is not always drawn at an angle of 45° to the trunk 1 having an L-shaped angle of 90°. If the L-shaped angle of the trunk 1 is 60°, the branch line 2 is drawn at an angle of about 30°.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A method for wiring together circuit blocks through an L-shaped channel located between said circuit blocks comprising the following steps:
    (a) defining a plurality of tracks and a plurality of columns in said L-shaped channel, said tracks and columns forming a grid-base;
    (b) defining a plurality of trunks in said L-shaped channel, such that each of said trunks occupies one of said tracks;
    (c) defining a plurality of branches in said L-shaped channel, said branches occupying said columns and intersecting said trunks so as to connect said circuit blocks;
    (d) manipulating the shape and position of said trunks so as to position said trunks in close proximity to one of said circuit blocks;
    (e) adjusting the length of said branches in conformance with the manipulation of said trunks; and
    (f) moving said circuit blocks together in order to reduce said L-shaped channels's width, thereby reducing the number of said tracks.

2. The method according to claim 1, wherein the manipulation of said trunks comprises either moving said trunks in a parallel direction along said tracks, or bending said trunks along said columns, or a combination of said moving and said bending of said trunks, so that said trunks occupy two of said tracks, thereby positioning said trunks in close proximity to an L-shaped side of one of said circuit blocks.

3. The method according to claim 1, further comprising the step of adjusting the shape of said trunks after moving said circuit blocks thereby eliminating any unnecessary bending occurring during the manipulation of said truncks.

4. The method according to claim 2, wherein said branches are stretched in order to adjust their length.

5. The method according to claim 2, wherein said branches are contracted in order to adjust their length.

6. The method according to claim 2, wherein some of said branches are stretched and some of said branches are contracted in order to adjust their length.

7. The method according to claim 1, wherein said trunks and branches connect one or more terminals of one of said circuit blocks to one or more terminals of said other circuit block, said terminals having the same potential.

8. A method for wiring together circuit blocks through an L-shaped channel located between said circuit blocks comprising the following steps:
    (a) defining a plurality of trunks in said L-shaped channel, said trunks being parallel to said circuit blocks L-shaped sides;
    (b) defining a plurality of branches in said L-shaped channel parallel to said L-shaped channel's middle angle direction, said branches intersecting said trunks so as to connect said circuit blocks;

(c) manipulating the shape and position of said trunks so as to position said trunks in close proximity to one of said circuit blocks L-shaped sides;

(d) adjusting the length of said branches in conformance with the manipulation of said trunks; and (e) moving said circuit blocks together in order to reduce said L-shaped channel's width.

9. The method according to claim 8, wherein the manipulation of said trunks comprises either moving said trunks in a direction parallel to said circuit block's L-shaped sides, or bending said trunks in a direction parallel to said L-shaped channel's middle angle direction, or a combination of said moving and said bending of said trunks.

10. The method according to claim 8, wherein said branches are stretched in order to adjust their length.

11. The method according to claim 8, wherein said branches are contracted in order to adjust their length.

12. The method according to claim 8, wherein some of said branches are stretched and some of said branches are contracted in order to adjust their length.

13. The method according to claim 8, further comprising the step of adjusting said trunks' shape after moving said circuit blocks in order to eliminate unnecessary bending that occurred during manipulation of said trunks.

14. The method according to claim 8, wherein said trunks and branches connect one or more terminals of one of said circuit blocks to one or more terminals of said other circuit block, said terminals having the same potential.

* * * * *